United States Patent [19]
Flynn

[11] Patent Number: 5,904,547
[45] Date of Patent: May 18, 1999

[54] APPARATUS FOR DICING A SEMICONDUCTOR DEVICE SUBSTRATE AND A PROCESS THEREFOR

[75] Inventor: Todd Flynn, Pflugerville, Tex.

[73] Assignee: Motorola, Inc., Schaumburg, Ill.

[21] Appl. No.: 08/780,119

[22] Filed: Dec. 26, 1996

[51] Int. Cl.[6] .................................................. H01L 21/301
[52] U.S. Cl. ........................................... 438/460; 438/465
[58] Field of Search ................................... 438/460, 461, 438/462, 463, 464, 465

[56] References Cited

U.S. PATENT DOCUMENTS

| | | | |
|---|---|---|---|
| 3,970,494 | 7/1976 | Pritchard | 438/464 |
| 3,997,963 | 12/1976 | Riseman | 438/461 |
| 4,086,375 | 4/1978 | LaChapelle, Jr. et al. | 438/461 |
| 4,925,808 | 5/1990 | Richardson | 438/460 |
| 5,091,331 | 2/1992 | Delgado et al. | 438/464 |
| 5,136,354 | 8/1992 | Morita et al. | 438/462 |
| 5,272,114 | 12/1993 | Van Berkum et al. | 438/460 |
| 5,358,590 | 10/1994 | Yamanaka | 438/464 |

OTHER PUBLICATIONS

Kulicke & Soffa Industries, Inc.; Fully Automated Wafer Dicing System Model 7500 brouchere (3 pages); 1995.

Ultra t Equipment Company, Inc.; Sawed/Scribed Wafer Cleaner Model SWC111M (1 page); 1992.

*Primary Examiner*—Kevin M. Picardat
*Attorney, Agent, or Firm*—George R. Meyer

[57] ABSTRACT

An integrated apparatus (10) has a dicing station (14) and a rinsing/heated drying station (16). In one embodiment, the rinsing/heated drying station (16) has a heater, such as an infrared lamp (36), or uses a heated gas. The integrating apparatus (10) helps to decrease the time between dicing and heated drying, which reduces the likelihood of corrosion of C4 bumps (64).

24 Claims, 3 Drawing Sheets

5,904,547

APPARATUS FOR DICING A SEMICONDUCTOR DEVICE SUBSTRATE AND A PROCESS THEREFOR

FIELD OF THE INVENTION

The present invention relates generally to apparatuses and processes for dicing, and more particularly, to apparatuses processes for dicing a semiconductor device substrate having a plurality of integrated devices.

BACKGROUND OF THE INVENTION

In the semiconductor industry, semiconductor wafers are diced to extract individual integrated devices. As a dicing station dices the individual integrated circuits, a stream of water flows over the dice to cool the semiconductor wafer and rinses debris off the wafer. An operator removes the semiconductor wafer from the dicing station and places it in a separate drying machine. An infrared heating lamp within the separate drying machine evaporates the water from a semiconductor wafer. This process is inefficient and adds defects to the semiconductor wafer.

Some wafers have C4 (controlled collapse chip connection) bumps that are conductive and contain lead and tin. During the dicing and rinsing operation, the C4 bumps retain water. Drying the semiconductor wafer with an inert gas at room temperature should be performed as soon as possible after the dicing operation to reduce the likelihood of C4 bump corrosion. Therefore, each semiconductor wafer in the dicing station is typically removed one at a time and taken over to the drying machine. Typically, a dicing station can hold 25 wafers. The total dicing time for 25 wafers is approximately 200 minutes if the dicing station continuously runs without stopping.

However, stopping the dicing station for every semiconductor wafer requires the overall time for the 25 wafers to increase by approximately 50 minutes. The dicing time is dependent on semiconductor wafer size and the speed of the saw. Having one apparatus dedicated to dicing and a different apparatus dedicated to drying requires more floor space, adds more costs, and can increase bottlenecks as wafers build up at either the drying apparatus or the dicing apparatus.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

An integrated apparatus has a dicing station and a rinsing/heated drying station. In one embodiment, the rinsing/heated drying station has a heater, such as an infrared lamp, or uses a heated gas. The integrating apparatus improves the throughput of the semiconductor device substrate during dicing and heated drying steps. Currently, dicing apparatuses do not have a station that performs the heated drying. Heated drying machines have been stand-alone pieces of equipment that increase floor space and production personnel demands. In one embodiment of the present invention, an integrated apparatus including a rinsing/heated drying station increases the throughput by not requiring that the dicing station to stop for each substrate. Present invention also decreases the defects on the semiconductor device substrate by eliminating the need for an operator to remove the semiconductor device substrate from the dicing apparatus and moving it over to the separate drying machine.

Figure 1:
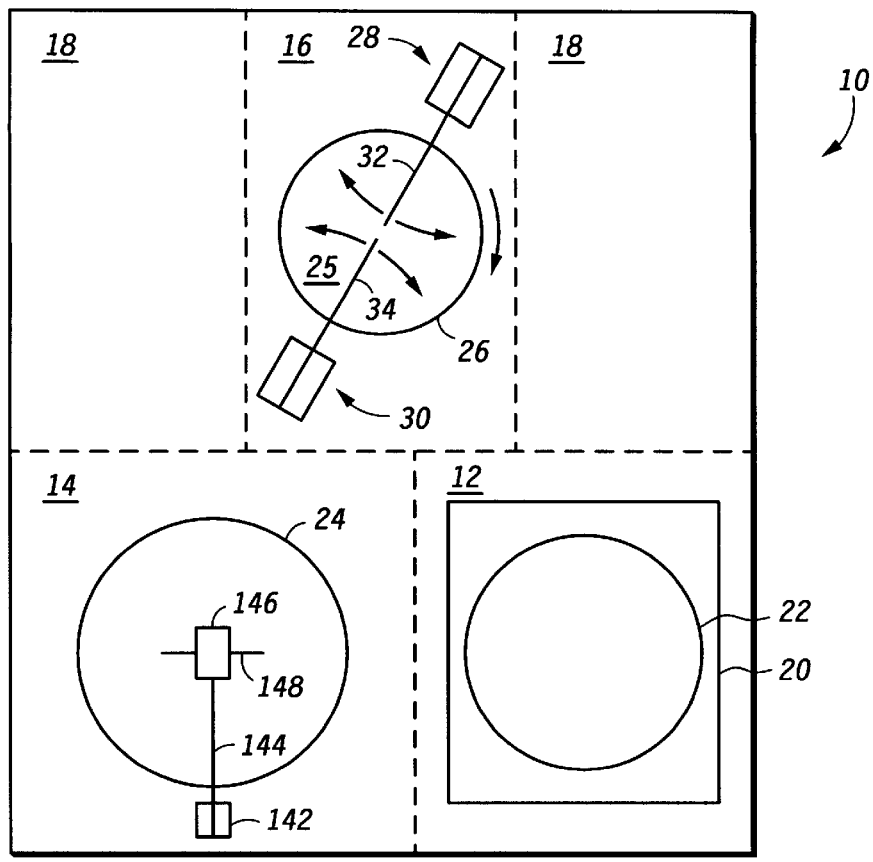
FIG. 1 includes an illustration of a top view of an integrated apparatus in accordance with the present invention.

FIG. 1 includes a top view of an integrated apparatus 10 having a substrate holding station 12, a dicing (sawing) station 14, a rinsing/heated drying station 16, and support stations 18. The holding station 12 includes a semiconductor device substrate cassette 20 that typically holds up to 25 semiconductor device substrates. The dicing station 14 includes a sawing platform, a sawing controller 142, a positioning arm 144, a sawing blade head 146, and a circular saw blade 148 within the head 146.

The rinsing/heated drying station 16 includes a chuck 26, a liquid rinsing mechanism 28, a gas injector 30, and positioning arms 32 and 34. The positioning arms 32 and 34 position nozzles at the ends of the arms 32 and 34 over the chuck 26. The liquid rinsing mechanism 28 dispenses a liquid at the nozzle of positioning arm 32, and the gas injector 30 flows a gas through the nozzle of positioning arm 34. In one embodiment, nitrogen gas is used to blow liquids off the surface of the semiconductor device substrates. The mechanism 28 and injector 30 control the positioning arms 32 and 34, respectively. The rinsing/heated drying station 16 lies adjacent to the support station 18.

Figure 2:
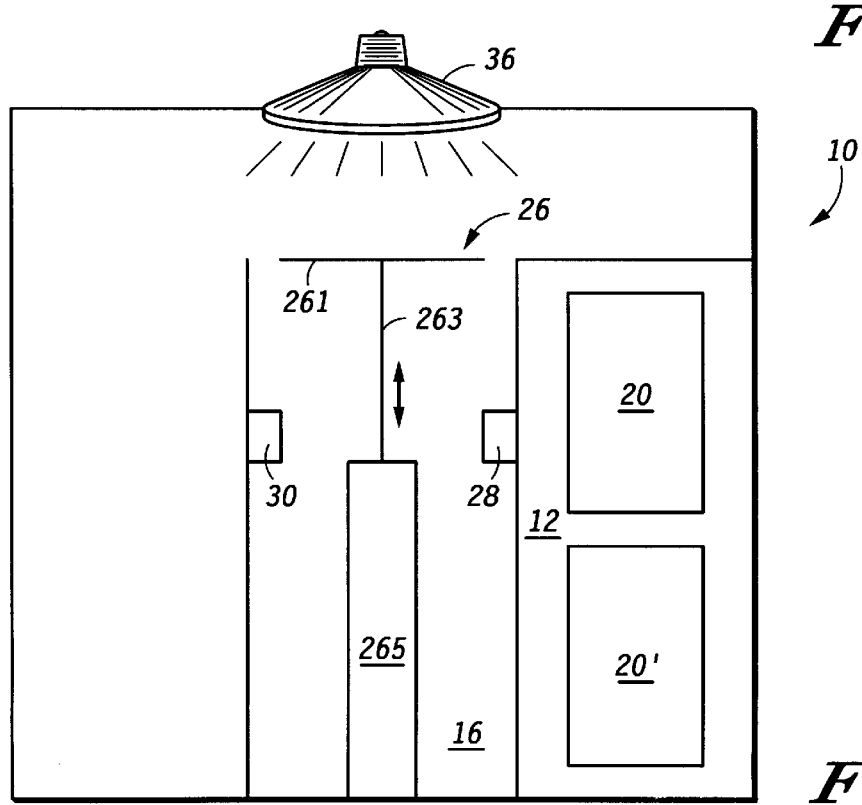
FIG. 2 includes an illustration of a side view of a rinsing station within the integrated apparatus in accordance with the present invention.

FIG. 2 includes a side view of the integrated apparatus including the rinsing/heated drying station 16 and cassette station 12. The rinsing/heated drying station 16 includes the chuck 26, the liquid rinsing mechanism 28, and the gas injector 30. The chuck 26 includes a semiconductor device substrate platform 261, a shaft 263, and a chuck controller 265. The shaft 263 is connected to the platform 261 and controller 265. The controller 265 controls the elevation of the platform 261 and the rotational speed of the platform 261. A heat source 36 overlies the chuck 26. In this embodiment, the heat source 36 is an infrared lamp having a tungsten filament. In other embodiments, a heated gas can be used in place of or in conjunction with the heat source 36. Cassette station 12 includes a semiconductor device substrate cassette 20, which is a sending cassette for semiconductor device substrates to be diced, and a semiconductor device substrate cassette 20', which is a receiving cassette for semiconductor device substrates that have been diced and dried.

Figure 3:
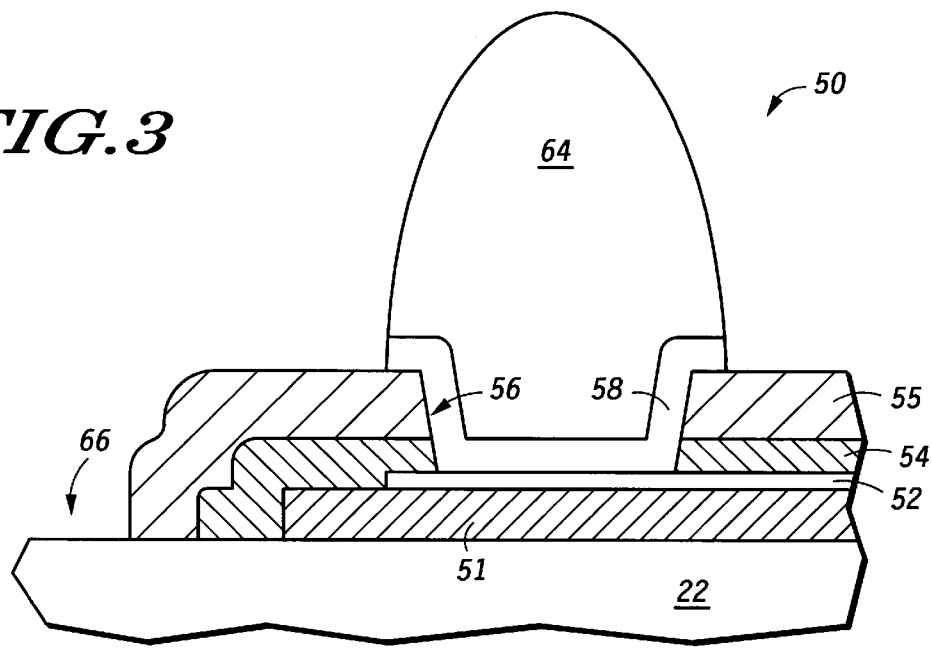
FIG. 3 includes an illustration of a cross-sectional view of a portion of a semiconductor device substrate with a C4 bump.
Figure 4:
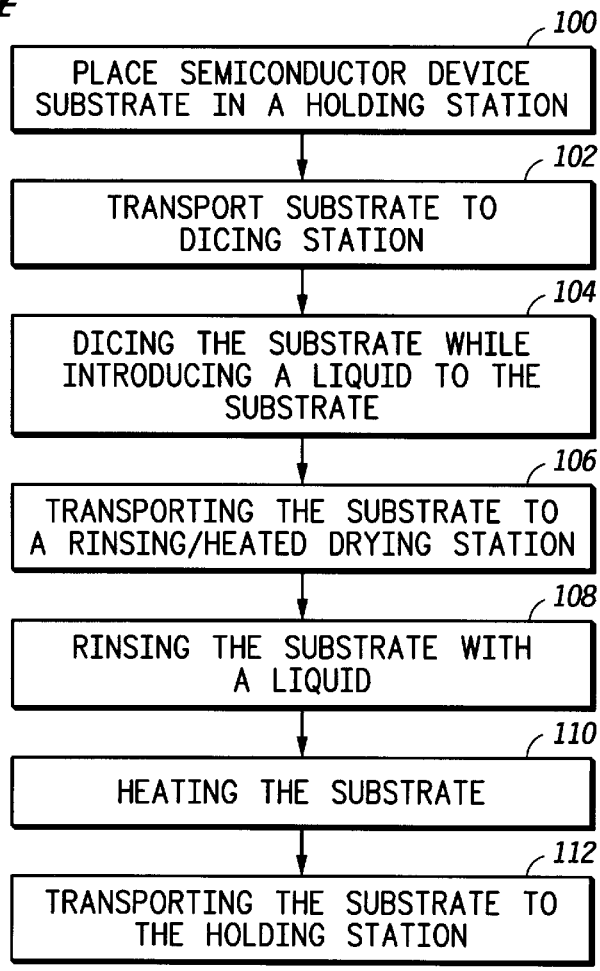
FIG. 4 includes a process flow in accordance with the present invention.

The integrated apparatus 10 is used to dice the semiconductor device substrate 22 in FIG. 3 using the process flow shown in FIG. 4. FIG. 3 illustrates a semiconductor device substrate 22 with a semiconductor device 50 and a C4 bump 64. The semiconductor device substrate 22 includes a monocrystalline semiconductor wafer, a semiconductor-on-insulator wafer, or other substrate used for semiconductor devices. A scribe line 66 lies adjacent to the semiconductor device 50. In one embodiment, the semiconductor device 50 is typically used in a process technology having gate widths no more than approximately a half micron.

The semiconductor device 50 includes an insulating layer 51 over the semiconductor device substrate 22. Although not shown in FIG. 1, transistors, diodes, capacitors, interconnects, and other insulating layers are present within the semiconductor device 50. An uppermost conductive layer 52 that includes an interconnect and an electrode pad overlies the insulating layer 51. A passivation layer 54 overlies the uppermost conductive layer 52, and a polyimide layer 55 overlies the passivation layer 54. A pad opening 56 extends through the passivation and polyimide layers 54 and 55. The bump connection layers 58 include chrome, copper and gold and lie within the pad opening 56 and over a portion of the polyimide layer 55. The C4 bump 64 overlies a bump connection layer 58 and partially lies within the pad opening 56. The C4 bump 64 includes lead and tin.

The substrate 22 is diced into a plurality of individual semiconductor devices similar to device 50 using the process flow in FIG. 4. The semiconductor device substrate 22 is placed into the sending cassette 20 that is placed in the holding station 12 of the integrated apparatus 10 (step 100). The substrate 22 is transported to the dicing station 14 and placed on the sawing platform 24 (step 102). The sawing blade 148 saws the substrate 22 while water, an oxidizing liquid, is introduced to the substrate 22 near the saw blade 148 (step 104). The water helps to dissipate heat and remove debris from the substrate 22 during sawing.

While the substrate 22 is still wet, it is transported to the rinsing/heated drying station 16 (step 106). The substrate 22 is placed onto the chuck platform 261 and rinsed with a liquid (step (108). The liquid rinsing mechanism 28 is activated, so that the arm 32 overlies the substrate 22. In one embodiment, a rinsing agent including water or an aqueous solution flows through the nozzle of arm 32 onto the substrate 22 while the chuck platform 261 is rotating. This rinsing step helps to remove most of the remaining debris left after the dicing operation.

Figure 5:
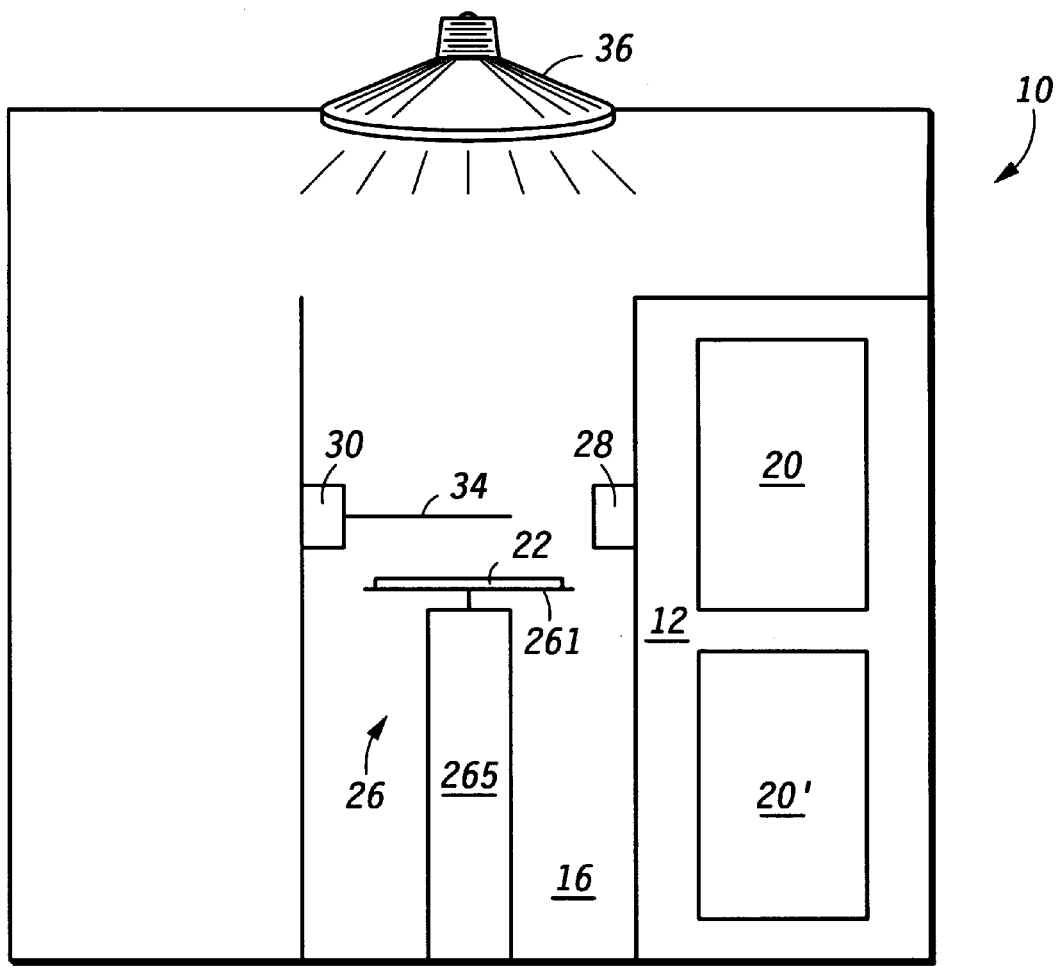
FIG. 5 includes an illustration of a side view of a semiconductor device substrate within the rinsing station of FIG. 2 during a processing step in accordance with the present invention.

The flow of rinsing agent stops and the substrate 22 is rotated at a high speed (typically greater than 1000 revolutions per minute) to remove most of the rinsing agent. The positioning arm 34 of the gas injector 30 moves over the substrate 22 as shown in FIG. 5. A gas flows through the nozzle of the injector 30 at least during a potion of the spin drying step. The rotational drying is typically performed without heat. Although most of the rinsing agent is removed during the rotation, it does not remove the portion of the rinsing agent that is absorbed into or adsorbed onto the C4 bump 64.

Unlike the prior art, the substrate 22 is heated within the rinsing/heated drying station 16 (step 110). After the rotating is terminated, the chuck controller 265 raises the platform and substrate 22 closer to the lamp 36 that emits infrared radiation. The lamp 36 is turned on to drive residual moisture from the C4 bump 64. Alternatively, heated gas may flow over the substrate to drive residual moisture from the C4 bump 64.

After heating the substrate 22, the substrate 22 is transferred to the receiving cassette 20' (step 112). To reduce the likelihood of oxidation of the C4 bump, an inert gas purge may be provided in station 12. The substrate is subsequently removed and packaged to form a substantially completed semiconductor device.

Many other embodiments of the present invention are possible. The heating step can be performed using a heated non-oxidizing gas, such as an inert gas, a reducing gas, and a combination thereof. The inert gas includes nitrogen, argon, helium, carbon dioxide, or the like, and the reducing gas includes hydrogen, carbon monoxide, nitrous oxide, or the like. For the reducing gases, concentrations of the reducing agent can be kept low to reduce the likelihood of explosion or toxic reactions with humans. For example, the reducing gas can be a forming gas including no more than approximately five percent hydrogen with the remainder nitrogen. Otherwise, safety modifications to the equipment may be required.

The integrated apparatus including the rinsing/heated drying station 16 has advantages. The substrate 22 can be dried at a time closer to the end of the rinsing step. As pointed out, the heated drying of the C4 bump 64 is used to reduce the likelihood of high resistance.

For a 200 mm diameter substrate, the dicing takes approximately seven minutes per substrate. The steps of rinsing, rotational drying, and heated drying should not exceed the time for dicing the substrate. Otherwise, the steps performed in the rinsing/heating drying station 16 controls the throughput of the integrated apparatus 10. Clearly, the heated drying step is performed within approximately seven minutes of the end of the dicing step. Usually, the heated drying step is performed within approximately one to three minutes from the completion of the dicing step.

As the size of substrates becomes larger (i.e., 300 mm diameter substrates), the need for a heated drying step becomes more important because the dicing step typically takes longer. The longer the C4 bumps are exposed to water, the likelihood of corrosion of the C4 bumps increases. The need for the integrated apparatus 10 should increase as substrate size increases.

By integrating the heated drying step into station 16, throughput increases and overall efficiency of the dicing operation improves. Other advantages include reducing the defect density, operator handling, floor space, and equipment costs.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

I claim:

1. A process for dicing a semiconductor device substrate comprising the steps of:

placing a semiconductor device substrate having a conductive bump into an apparatus;

dicing the semiconductor device substrate into a plurality of dice while in the apparatus; and heating the plurality of dice after the step of dicing while the plurality of dice is in the apparatus.

2. The process of claim 1, further comprising a step of rinsing the plurality of dice with water between the steps of dicing and heating.

3. The process of claim 1, wherein the step of dicing comprises steps of:
   dicing the semiconductor device substrate using a saw blade; and
   introducing water near the saw blade while dicing.

4. The process of claim 1, wherein the step of heating is performed using a lamp that emits infrared radiation.

5. The process of claim 1, wherein the step of heating is performed using a heated non-oxidizing gas.

6. The process of claim 5, wherein the heated non-oxidizing gas is selected from a group consisting of nitrogen, argon, helium, and carbon dioxide.

7. The process of claim 5, wherein the heated non-oxidizing gas is selected from a group consisting of hydrogen, carbon monoxide, and nitrous oxide.

8. The process of claim 1, wherein:
   the semiconductor device substrate includes an interconnect with an electrode and a passivation overlying the interconnect with an opening over the electrode;
   the conductive bump lies within the opening and is electrically connected to the electrode;
   the electrode includes a first metal; and
   the conductive bump includes a second metal that is different from the first metal.

9. The process of claim 1, wherein the conductive bump includes a first metal and a second metal that is different from the first metal.

10. The process of claim 1, further comprising steps of:
    transporting the plurality of dice into a holding station within the apparatus after the step of dicing; and
    introducing an inert gas into the holding station while the plurality of dice are within the holding station.

11. The process of claim 1, wherein:
    the step of dicing is performed for a first time period; and
    the step of heating is performed for a second time period that is no greater than the first time period.

12. The process of claim 1, wherein:
    the step of dicing comprises steps of:
       introducing a stream of an oxidizing liquid to the semiconductor device substrate; and
       terminating the stream of the oxidizing liquid at a first time;
    the step of heating is performed at a second time; and
    the second time is within approximately seven minutes of the first time.

13. The process of claim 1, wherein:
    the step of dicing is performed for a first time period; and
    the step of heating is performed for a second time period that is shorter than the first time period.

14. A process for dicing a semiconductor device substrate comprising the steps of:
    placing a semiconductor device substrate into an apparatus, wherein the semiconductor device substrate has:
       an interconnect with an electrode;
       a passivation overlying the interconnect with an opening over the electrode; and
       a conductive bump lying within the opening and electrically connected to the electrode;
    dicing the semiconductor device substrate in a presence of an oxidizing liquid into a plurality of dice while in the apparatus;
    rinsing the plurality of dice with a rinsing agent while in the apparatus;
    removing rinsing agent from a surface of the plurality of dice while in the apparatus; and
    heating the plurality of dice to reduce a content of the rinsing agent near the conductive bump while in the apparatus.

15. The process of claim 14, wherein:
    the oxidizing liquid includes water;
    the rinsing agent includes water; and
    the step of removing includes a step of rotating the plurality of dice to remove most of the rinsing agent overlying the plurality of dice.

16. The process of claim 14, wherein the step of heating is performed using a lamp that emits infrared radiation.

17. The process of claim 14, wherein the step of heating is performed using a heated non-oxidizing gas.

18. The process of claim 17, wherein the heated non-oxidizing gas is selected from a group consisting of nitrogen, argon, helium, and carbon dioxide.

19. The process of claim 17, wherein the heated non-oxidizing gas is selected from a group consisting of hydrogen, carbon monoxide, and nitrous oxide.

20. The process of claim 14, wherein:
    the electrode includes a first metal; and
    the conductive bump includes a second metal that is different from the first metal.

21. The process of claim 14, wherein the conductive bump includes a first metal and a second metal that is different from the first metal.

22. The process of claim 14, further comprising steps of:
    moving the plurality of dice into a holding station within the apparatus; and
    introducing an inert gas into the holding station while the plurality of dice are within the holding station.

23. The process of claim 14, further comprising a step of rotating the plurality of dice during the step of heating.

24. An apparatus for dicing a semiconductor device substrate comprising:
    a dicing station capable of dicing a semiconductor device substrate into a plurality of dice; and
    a heater spaced apart from the dicing station, wherein the dicing station and the heater lie within the apparatus.

* * * * *